United States Patent [19]

Hikami

[11] Patent Number: 5,098,885
[45] Date of Patent: Mar. 24, 1992

[54] SUPERCONDUCTIVE SUBSTANCE $Y_{0.294}BA_{0.336}CU_{01.77}$

[75] Inventor: Shinobu Hikami, Yokohama, Japan

[73] Assignee: The University of Tokyo, Tokyo, Japan

[21] Appl. No.: 566,799

[22] Filed: Aug. 13, 1990

Related U.S. Application Data

[63] Continuation of Ser. No. 147,372, Jan. 21, 1988, abandoned.

[30] Foreign Application Priority Data

Mar. 13, 1987 [JP] Japan ................... 62-58409

[51] Int. Cl.$^5$ .................... H01L 39/12; H01B 1/08
[52] U.S. Cl. ........................ 505/1; 252/518;
252/521; 423/263; 423/593; 423/604; 423/635;
501/152; 505/725; 505/780; 505/809
[58] Field of Search .................. 505/1, 809, 780, 725;
252/518, 521; 501/152; 423/263, 593, 604, 635

[56] References Cited

FOREIGN PATENT DOCUMENTS 0280812  9/1988  European Pat. Off. .

OTHER PUBLICATIONS

Qadri et al., "X-ray Identification of the Superconducting High $T_c$ Phase in the Y-Ba-Cu-O System", Preprint from the NRL, Available 3/6/87.
Chemical Abstract No. 83 (10): 90035f from *J. Chem. Soc., Dalton Trans.*, (11) 1061-6, 1975.
Hosoya, S. et al., *Japanese Journal of Applied Physics*, vol. 26, No. 4, pp. L456-567 (4/1987).
Syono, Y. et al., *Japanese Journal of Applied Physics*, vol. 26, No. 4, pp. L498-501 (4/1987).
Takajama-Muromachi, E. et al., *Japanese Journal of Applied Physics*, vol. 26, No. 4, pp. L476-478 (Apr. 1987).
Takabatake, T. et al., *Japanese Journal of Applied Physics*, vol. 26, No. 4, pp. L502-503 (4/1987).
Qadri, S. et al., *Physical Review B*, pp. 7235-7237 (May 1987) (vol. 35, No. 13).
Umarji, A. et al., *Solid State Communications*, vol. 66, No. 2, pp. 177-180 (1988).
Er-Rakho, L. et al., *Journal of Solid State Chemistry*, vol. 37, pp. 151-156 (1981).
Provost, J. et al., *Synthetic Metals*, 4(1981), pp. 157-167.
Nguyen, N. et al., *Journal of Solid State Chemistry*, vol. 39, pp. 120-127 (1981).
Bednorz, J. G. et al., *Z. Phys. B-Condensed Matter*, vol. 64, pp. 189-193 (1986).
Wu et al., *Physical Review Letters*, vol. 58, No. 9, pp. 908-910 (Mar., 1987).
Sun, J. et al., *Physical Review Letters*, vol. 58, No. 15 (Apr., 1987).
Semba, K. et al., *Japanese Journal of Applied Physics*, vol. 26, No. 4, pp. L429-431 (4/1987).
Hirabayashi, M. et al., *Japanese Journal of Applied Physics*, vol. 26, No. 4, pp. L454-455 (4/1987).
Pramana Journal of Physics, vol. 28, No. 3, Mar. 1987, pp. L321-L323.

*Primary Examiner*—Paul.Lieberman
*Assistant Examiner*—Linda D. Skaling
*Attorney, Agent, or Firm*—Sughrue, Mion, Zinn, Macpeak & Seas

[57] ABSTRACT

The disclosed substance has a composition of $Y_x Ba_y CuO_z$, wherein $x=0.2-0.5$ $y=0.2-0.5$ and $z \simeq 1+y+(3/2)x$, with a face-centered tetragonal crystalline structure of perovskite type. When being cooled at 85–135 K, the structure of the substance starts to transform and its electric resistance disappears at a temperature higher than 47 K so that the substance becomes superconductive.

4 Claims, 10 Drawing Sheets

FIG_6A
Specimen No.16, Substantially Spherical,
dia. 0.7mm
H=11.2 Oe
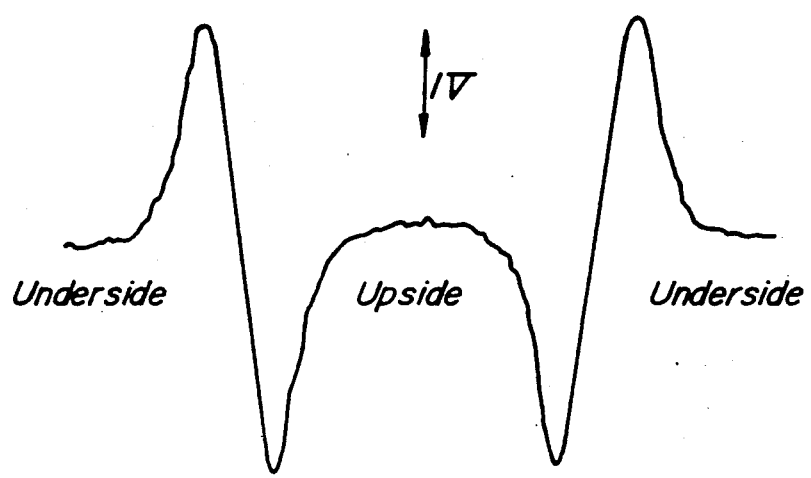
FIG_6B
Specimen No.12  2mm × 1.9mm × 0.5mm
H = 48 Oe
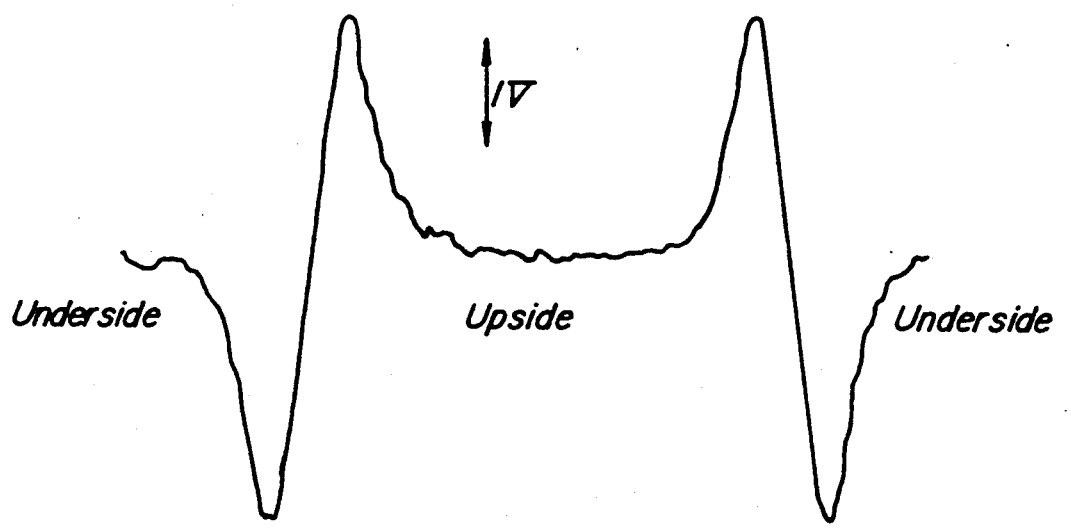

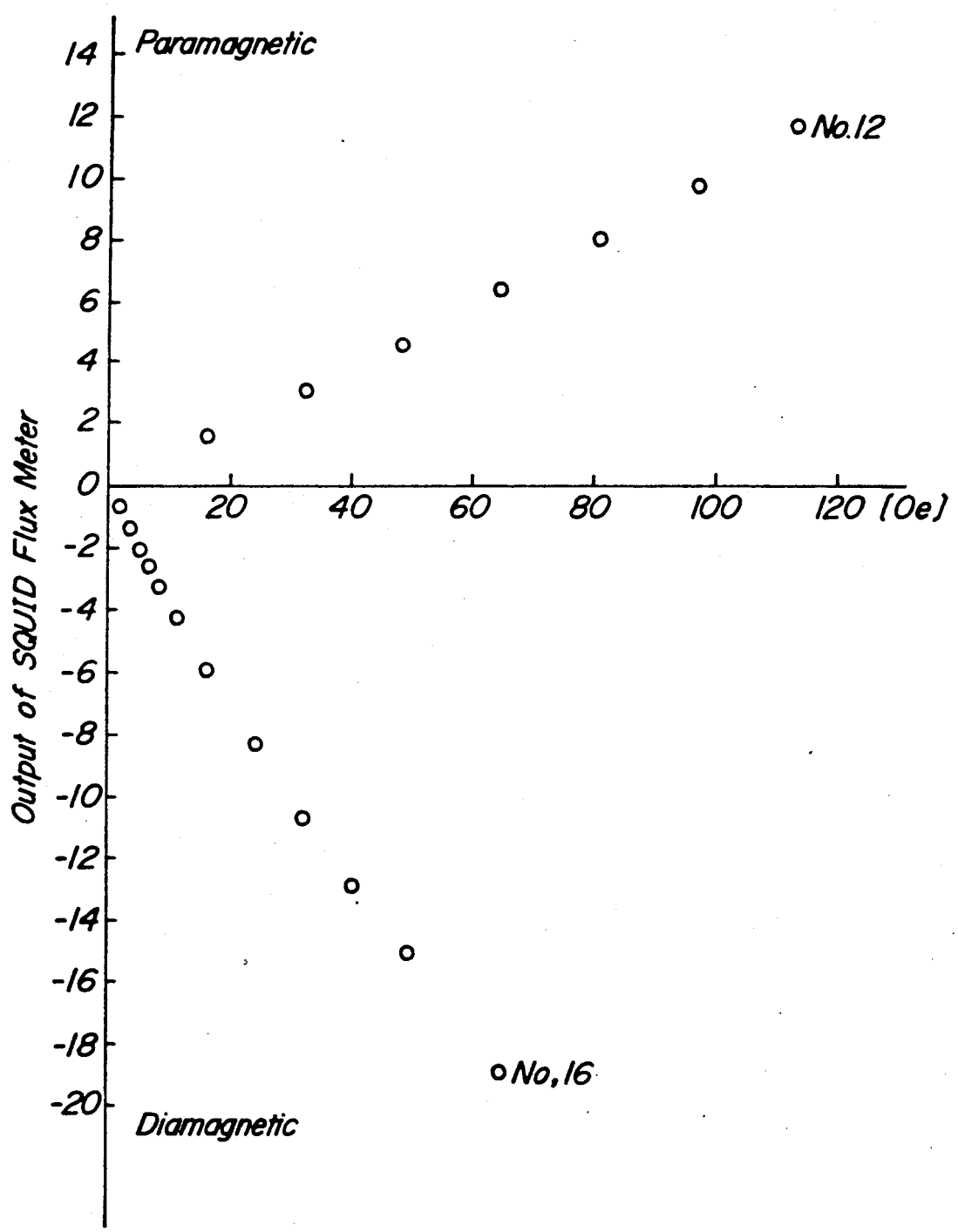

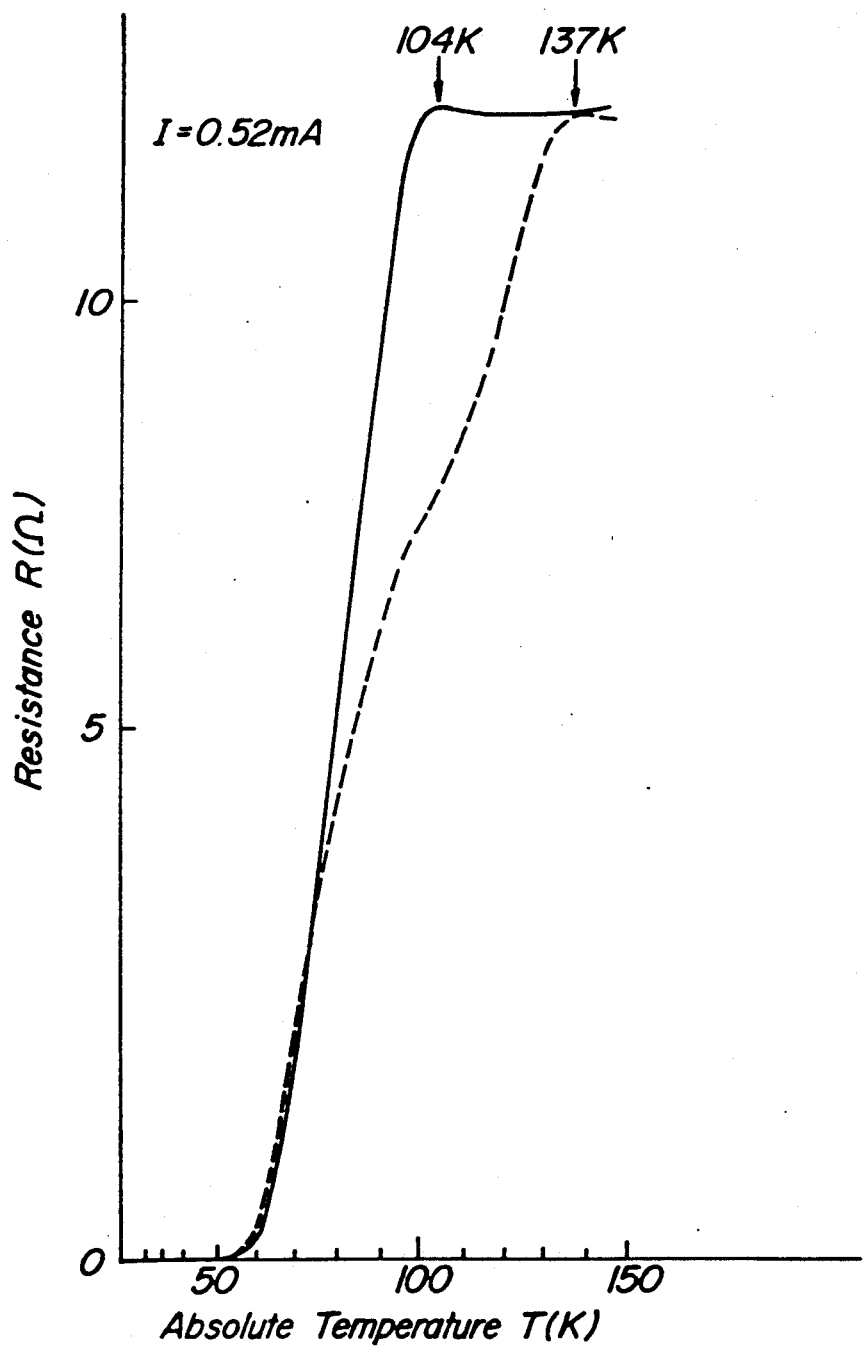
FIG_9

FIG_10
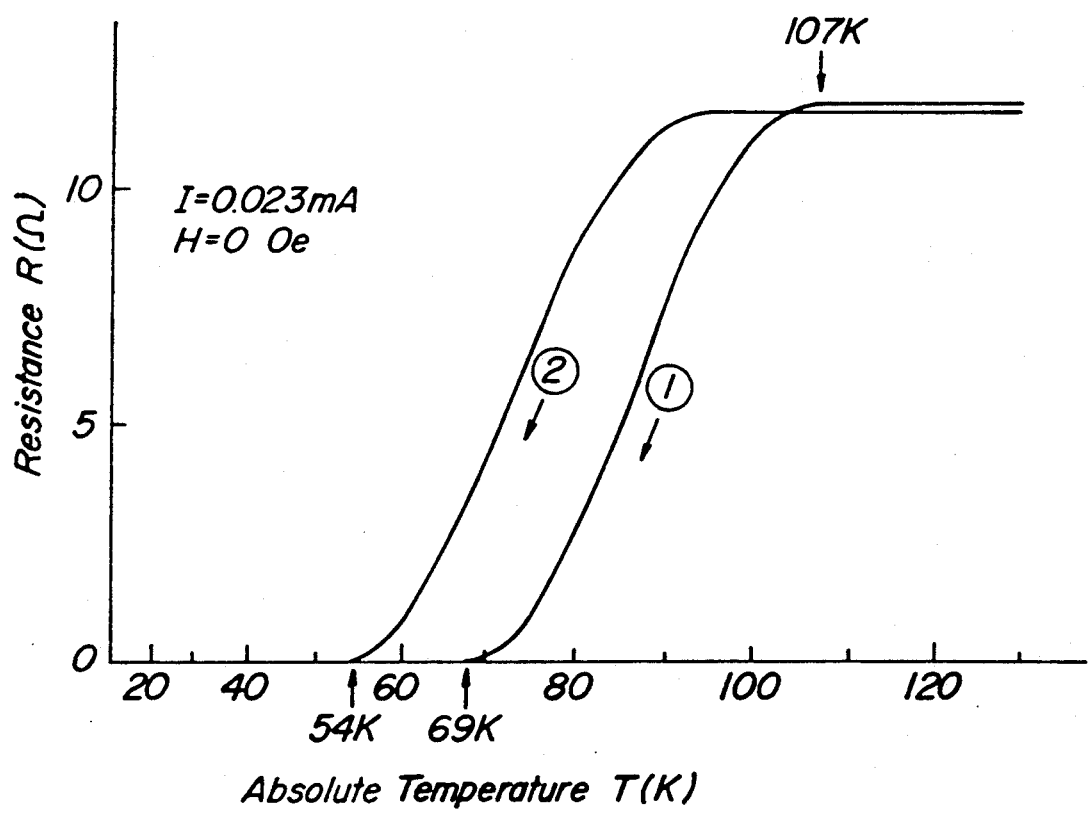

5,098,885

SUPERCONDUCTIVE SUBSTANCE
$Y_{0.294}BA_{0.336}CU_{01.77}$

This is a Continuation of Application Ser. No. 07/147,372 filed Jan. 21, 1988, now abandoned.

BACKGROUND OF THE INVENTION

1. Field of the Invention

This invention relates to a superconductive substance whose electric resistance disappears at a low temperature. More particularly, the invention relates to a so-called high-temperature superconductor which can be made superconductive by liquid nitrogen coolant.

2. Description of the Prior Art

With conventional superconductors, cooling by costly liquid helium (whose boiling point is 4.2 K) at very low temperatures is indispensable. Practical use of the superconductor has been restricted only to very special cases due to the high cooling cost and the limited availability of helium resources in certain countries.

The superconductive substance which has the highest critical temperature so far has been confirmed to be $Nb_3Ge$. Its critical temperature (i.e. transformation-starting temperature) Tc is 23.6° K. which is not high enough to be achieved by cooling with liquid nitrogen (whose boiling point is 77° K.).

It has been reported that superconductors made of oxides of La-(Ba, Sr)-Cu system have a transformation temperature in a range of 25°–45° K. However, the temperature at which the electric resistance of the above oxides completely disappears is about 25° K. With the above oxides, that temperature at which they start to become superconductive is lower than the nitrogen boiling point (i.e., 77° K.), and the highest of such superconductivity-starting temperatures reported in Japan is 54° K. Thus, such substance which starts to become superconductive at a temperature above the nitrogen boiling point of 77 K has not been developed yet.

Heretofore, the coolant for producing superconductivity has been limited to either liquid helium at very low temperatures or liquid hydrogen (whose boiling point is 20 K). Helium is expensive, and liquid hydrogen is dangerous to handle. Accordingly, there has been a need for such new superconductive substance of which critical temperature for superconductivity is so high that the material can be cooled by liquid nitrogen. Liquid nitrogen (whose boiling point under atmospheric pressure is 77 K) as a coolant is much cheaper than liquid helium and safer than liquid hydrogen.

Generally speaking, the following conditions must be met in order to confirm the superconductivity of a substance.

(a) In addition to the data on electric resistance, the structure of the substance is clearly identified.

(b) The properties of the substance are stable and the results of tests on them are reproducible.

(c) The electric resistance rapidly reduces with temperature reduction over a range of a few degrees from a certain temperature (superconductive transformation-starting temperature).

(d) The substance shows the Meissner effects, namely perfect diamagnetism, that is peculiar to the superconductive phenomenon.

(e) Related physical properties, such as the magnetic susceptibility, the critical current, and the critical magnetic field intensity, of the substance are measured and proved.

No superconductive substance having a high critical temperature suitable for liquid nitrogen coolant while meeting all of the above five conditions has been found yet. Thus, such superconductive substance which is practically usable at a temperature above the nitrogen boiling point has not been developed yet.

SUMMARY OF THE INVENTION

Therefore, an object of the invention is to obviate the above-mentioned limitation of the conventional superconductive substances, such as La-(Ba, Sr)-Cu-O type substance, in that their transformation for superconductivity cannot be started at a temperature higher than the boiling point of nitrogen.

An object of the present invention is to provide an economical and practical superconductive substance whose transformation starts at 85°–137° K., i.e., above the nitrogen boiling point 77° K., and whose electric resistance disappears at 47°–69° K. so as to become superconductive.

The inventors have carried out a series of studies on superconductive substances, and succeeded in selecting practicable high-temperature super conductors from oxides of yttrium-barium-copper-oxygen (Y-Ba-Cu-O) type (mixtures of oxides having various crystal structures). The structure of the selected superconductor was identified, and the inventors confirmed that their superconductive transformation-starting temperature was above 77° K. and their electric resistance disappeared at a temperature above 47° K. The selected superconductive substance can be cooled by a coolant having a boiling point of 77° K. or higher. Thus, the inventors have fulfilled the above-mentioned object of the invention.

A superconductive substance according to the invention is made of ceramics consisting essentially of a composition given by a general formula of $Y_xBa_yCuO_z$, wherein x is a constant of 0.2 to 0.5, y is a constant of 0.2 to 0.5, and $z = 1 + y + 1.5x$. The substance has a face-centered tetragonal crystalline structure of perovskite type with lattice parameters a, b and c under conditions of $a = b \neq c$ and an axial angle of 90 degrees. When the substance is cooled from a temperature above the boiling point of nitrogen (77° K.), the material starts to transform at 85°–137° K. and electric resistance of the substance disappears at a temperature higher than 47° K. so that the substance becomes superconductive.

In the superconductive substance according to the invention, if the above constant x is smaller than 0.2, the superconductivity of the substance cannot be produced, while if it is larger than 0.5, its superconductivity is deteriorated. In the substance, yttrium (Y) may have a valence three, and barium (Ba) may have a valence two, and copper (Cu) may have a valence two in the main while allowing possible coexistence of copper of valence three.

When a mixture consisting of the ingredients of the above-mentioned general formula according to the invention is sintered (or shaped under pressure and subjected to secondary sintering), the sintered substance may or may not have the same chemical composition as that of the starting mixture. The content of oxygen may change depending on the atmosphere. It should be noted that both of the composition after the above change due to sintering and the oxygen content after the above change depending on the atmosphere are within the scope of the invention.

Referring to the above general formula, a part of barium in it may be replaced with a substance which mainly consists of an element with a valence two, such as strontium (Sr).

What is meant by the clause "mainly consisting essentially of" in the present invention is that the element(s) specified by such clause represent(s) major portions of the relevant substance, and the scope of the invention does not exclude presence of other unspecified ingredients or metals in such an amount that their presence causes no harmful effects on the crystal structure of the substance and does not interfere with the object of the invention.

In short, the ceramics material mainly consisting essentially of the composition of the above general formula starts its transformation into superconductor at a higher critical temperature than that of conventional superconductors, more particularly at a temperature higher than 77° K. which is the boiling point of liquid nitrogen.

BRIEF DESCRIPTION OF THE DRAWING

For a better understanding of the invention, reference is made to the accompanying drawing, in which:

FIG. 6A shows curves representing those flux meter output patterns which demonstrate the superconductivity of the oxides of Y-Ba-Cu-O system;

FIG. 6B shows curves representing those flux meter output patterns which demonstrate the paramagnetism of the oxides of Y-Ba-Cu-O system under the absence of the superconductivity;

FIG. 7 is a graph showing the magnetization the oxides of Y-Ba-Cu-O system in terms of the flux meter output peaks of FIG. 6A and FIG. 6B for both the superconductive conditions and the regular conductive conditions;

FIG. 9 is a graph showing the temperature-dependency characteristics of the electric resistance of the oxide of Y-Ba-Cu-O system when a current $I=0.52$ mA is applied thereto while a magnetic field $H=\pm27$ kOe is applied at 81° K. but removed thereafter; and FIG. 10 is a graph showing the temperature-dependency characteristics of the electric resistance of the oxide of Y-Ba-Cu-O system when a current therethrough is reduced to $I=0.023$ mA without any magnetic field, i.e., $H=0$,

DESCRIPTION OF THE PREFERRED EMBODIMENT

The invention will be now described in further detail by referring to embodiments, but it should be understood that the invention is not restricted by the embodiments.

Embodiment 1

Specimens of yttrium-barium-copper-oxygen system according the above general formula were prepared, in which x was 0.294 and y was 0.336. More particularly, calculated amounts of reagents of special grade, powders of $Y_2O_3$, $BaCO_3$, and $CuO$ were measured and mixed. The mixture was placed in a crucible or a crucible-shaped alumina vessel, so as to be fired for about two hours at 800°-850° C. in an electric furnace. The fired mixture was formed into pellets by a press under a pressure of about 4 Kbar, and the pellets were sintered for approximately one hour at about 800° C.

The superconductive transformation temperature of the Specimens thus prepared were checked by measuring their electric resistance. The transformation into superconductivity was found to start at 85° K., and it was proved that complete zero electric resistance prevailed at temperatures below 45° K. Analysis by x-ray diffraction method showed that the Specimens had a crystal structure which was close to that of the perovskite type.

Figure 1:
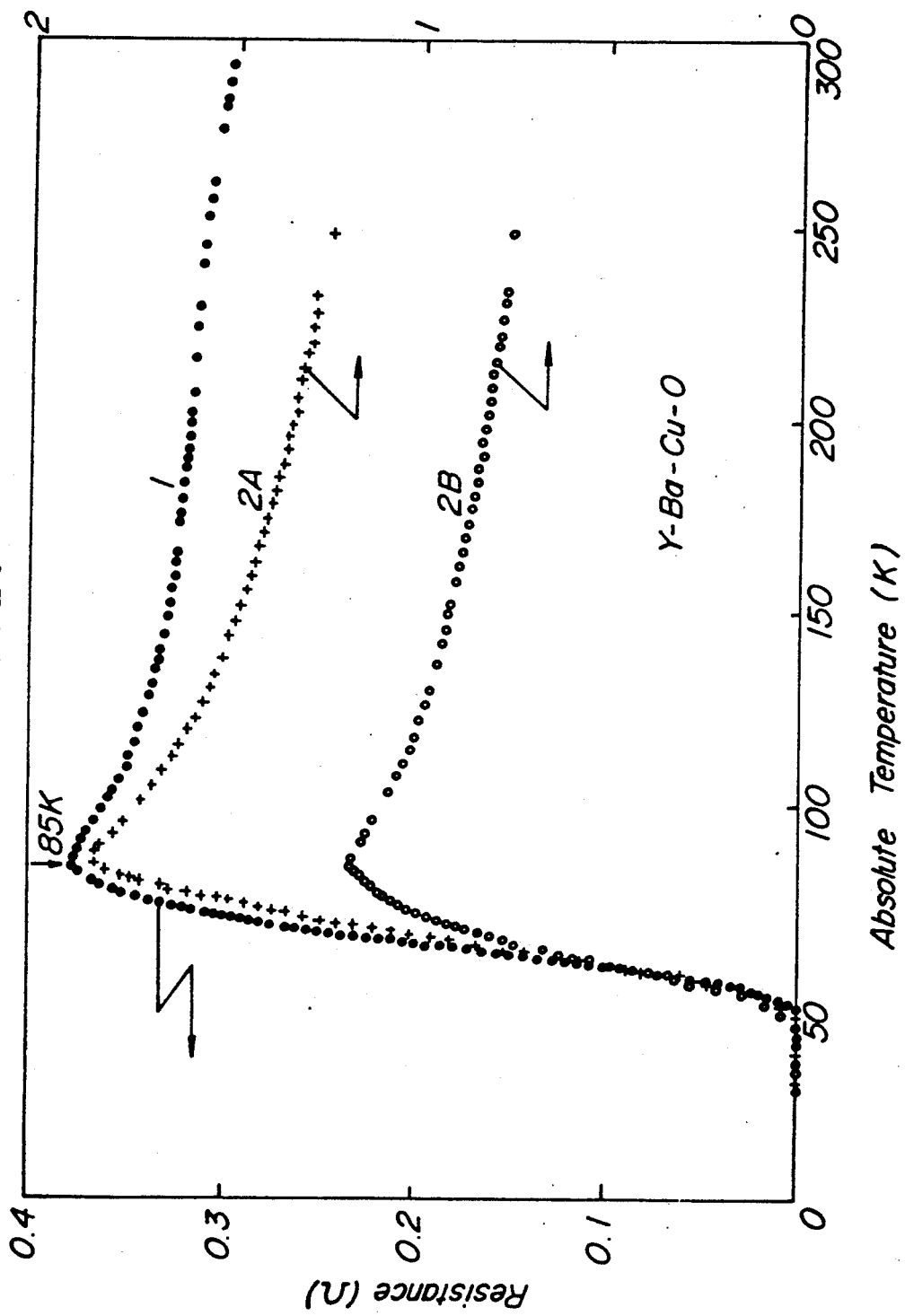
FIG. 1 is a graph showing the relation between the electric resistance of oxides of Y-Ba-Cu-O system of the invention and the temperature.

FIG. 1 shows the variation of the electric resistance in response to temperature change for Specimen 1 ($Y_{0.294}Ba_{0.336}Cu_1$) and Specimens 2A, 2B ($Y_{0.352}Ba_{0.336}Cu_1$). The Specimens were prepared by burning, shaping and sintering the ingredient materials in the above-mentioned manner. The abscissa of the figure represents the absolute temperature (K), while its ordinate represents the electric resistance ($\Omega$). As can be seen from the figure, the superconductive transformation-starting temperature of the Specimens 1, 2A and 2B was 85° K., and their electric resistances became zero at 50° K. Thus, it was confirmed that the Specimens 1, 2A and 2B were superconductors as far as the electric resistance was concerned.

Embodiment 2

Oxides of yttrium-barium-copper-oxygen (Y-Ba-Cu-O) system were made by heating starting mixtures at 800°-900° C. for 2 hours, and the fired mixture were shaped into pellets by a press at an elevated pressure of 4 Kbar, and the pellets were sintered for two hours by reheating at 800° C. Different Specimens were prepared by using different (Y, Ba):Cu ratio in the starting mixture. The (Y, Ba):Cu ratio for producing good superconductivity is about 0.6:1. Among the Specimens thus prepared, those having a composition outside the above ratio were almost insulators and did not show superconductivity. Specimen 1 with a composition of $Y_{0.294}Ba_{0.336}Cu_1$ showed superconductivity as illustrated in FIG. 2.

Specimens 2A and 2B with a like composition of $Y_{0.352}Ba_{0.336}Cu_1$ showed superconductivity and their transformation temperature was almost the same as that of Specimen 1.

On the other hand, Specimen 3 made from a starting mixture with a composition of $Y_{0.411}Ba_{0.336}Cu_1$ turned out an insulator. The color of Specimen 3 was greenish black and it was different from the black color of Specimens 1 and 2. In the case of black Specimens 1 and 2, a large number of several μm long metal like fine crystals with metallic luster were observed. Conventional La-Sr-Cu-O oxides do not have such metallic luster. Specimens 1 and 2 had a resistivity of 60 mΩ·cm at room temperatures, and their superconductive transformation-starting temperature was 85° K.

Figure 2:
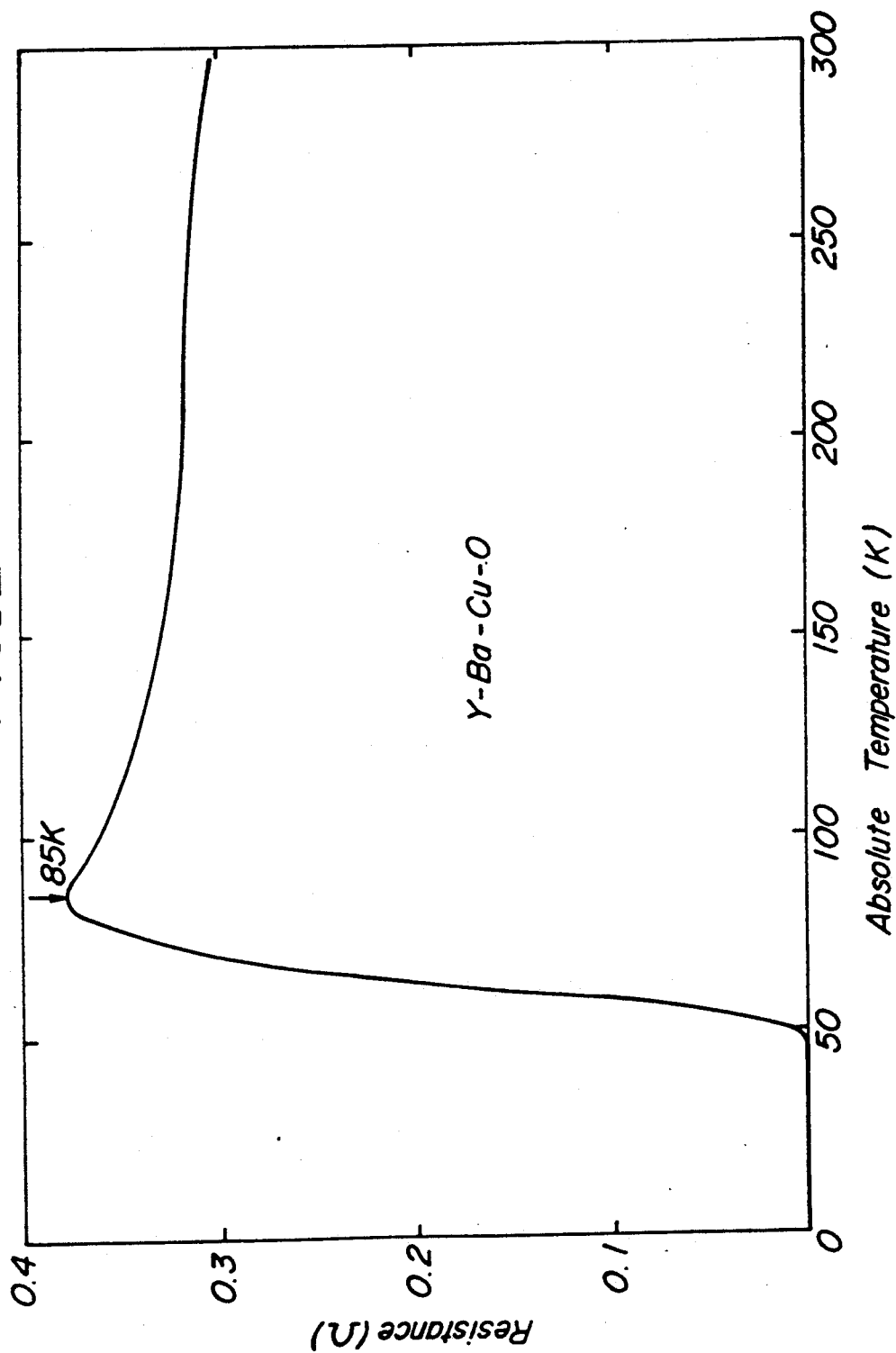
FIG. 2 is a graph showing the temperature-dependent characteristics of the electric resistance of oxide pellets of Y-Ba-Cu-O system.

The low temperatures of FIG. 1 and FIG. 2 were measured by using a silicon diode sensor having graduations which were calibrated by a graduated-indicator type platinum resistance thermometer on the market. The resistances of Specimens were measured by the four-probe method. Four probes were applied to one surface of a rectangular piece (7 mm×6 mm×0.8 mm) by silver paint, which rectangular piece was cut out of a pellet of each Specimen. The intermediate point of the superconductivity was about 65° K. In the case of Specimens 1 and 2, it was observed that, when the current density was 21 mA/cm$^2$, the electric resistance completely disappeared at 45° K.

A common Ba:Cu ratio was used in both Specimens 1 and 2. Any change in the Ba:Cu ratio was found to affect the superconductivity.

The somewhat slow reduction of resistance of FIG. 1 in a region below the superconductive transformation-starting temperature appear to be related to the presence of weak linkage among small superconductors produced by the powder method. The maximum resistivities of Specimens 1, 2A and 2B were 76, 250 and 242 mΩ·cm respectively. This result was the same during the cooling run and the heating run.

Embodiment 3

The critical current of the above Specimens of the oxides of Y-Ba-Cu-O system were measured in order to confirm the characteristics of the high transformation-starting temperature Tc thereof. It was found that when the apparent resistance was zero at 9.5° K., the critical current density Jc for the sintered Specimens was about 1.7 A/cm$^2$. For currents with a current density smaller than the above critical value JC the resistivity of the Specimens was less than 2.3 μΩ·cm.

Judging from the result of x-ray diffraction analysis, the fundamental crystal structure of the Specimens was of the perovskite type. Eight units of the perovskite-type structures formed a unit cell of face-centered tetragonal crystal structure with the following lattice parameters:

$$a = b = 7.83 \pm 0.02 \text{ Å}$$

$$c = 7.72 \pm 0.03 \text{ Å}$$

The measurement of D.C. resistivity of the sintered Specimens showed that the resistivity started to reduce at the transformation-starting critical temperature 85° K., and its value at the medium point 65° K. was one half of that at 85° K., and the resistance disappeared completely at temperatures below 45° K.

However, the resistance disappearance does not necessarily provide full support for the presence of superconductivity. As a first step to identify the properties of the substance of the Specimens, their current-voltage characteristics at temperatures below 92 K was measured. The result proved that their characteristics curve was the same as that of superconductors.

The x-ray diffraction analysis indicated that the crystal structure of the Y-Ba-Cu-O system oxides was not of laminar perovskite type but it was of tetragonal perovskite type in the main.

Critical current

Sintered specimens for the critical current measurement were the same as those for resistivity measurement, i.e. Speciman 1 of FIG. 1. The Specimans and a graduated indicator type silicon diode thermometer were placed in a test vessel which was filled with helium gas. The distance between the voltage probes was about 0.25 cm, and the cross-section of the current path was about 0.6 cm by 0.08 cm. The largest resistivity measured immediately before reaching the transformation-starting critical temperature 85° K. was 76 mΩ·cm (milli ohm centimeter). FIG. 2 illustrates the measured behavior of the resistance of one Specimen over the entire temperature range 0°–300° K. with a current density of 21 mA/cm$^2$.

Figure 3:
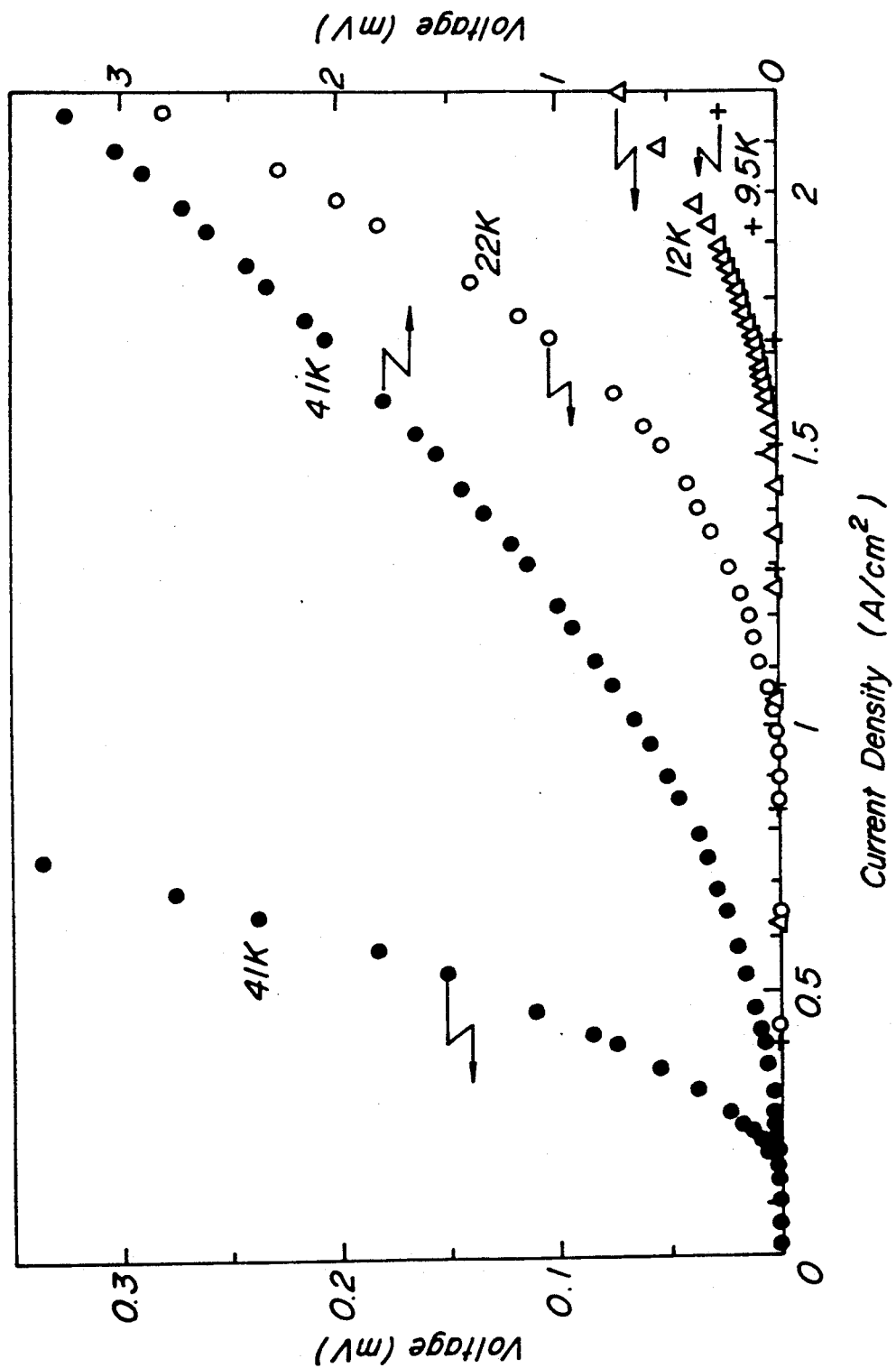
FIG. 3 and FIG. 4 are graphs showing the relation between the electric current density in oxide pellets of Y-Ba-Cu-O system and voltage thereof.

FIG. 3 shows the current-voltage (I-V) characteristic curves of the Specimen measured at temperatures 9.5° K., 12° K., 22° K. and 44° K. At such temperatures of FIG. 3, the resistance of the Specimen could become below the measurable limit. In the case of 9.5° K., the output voltage remained below the measurable limit 1 μV until the current increased up to 82 mA. Consequently, the critical current Jc for 9.5° K. was determined to be Jc = 1.7 mA/cm$^2$. The resistivity of the Specimen should have been 2.3 μΩ·cm for current densities below the above critical value Jc. The critical current reduced with the increase of the temperature.

Figure 4:
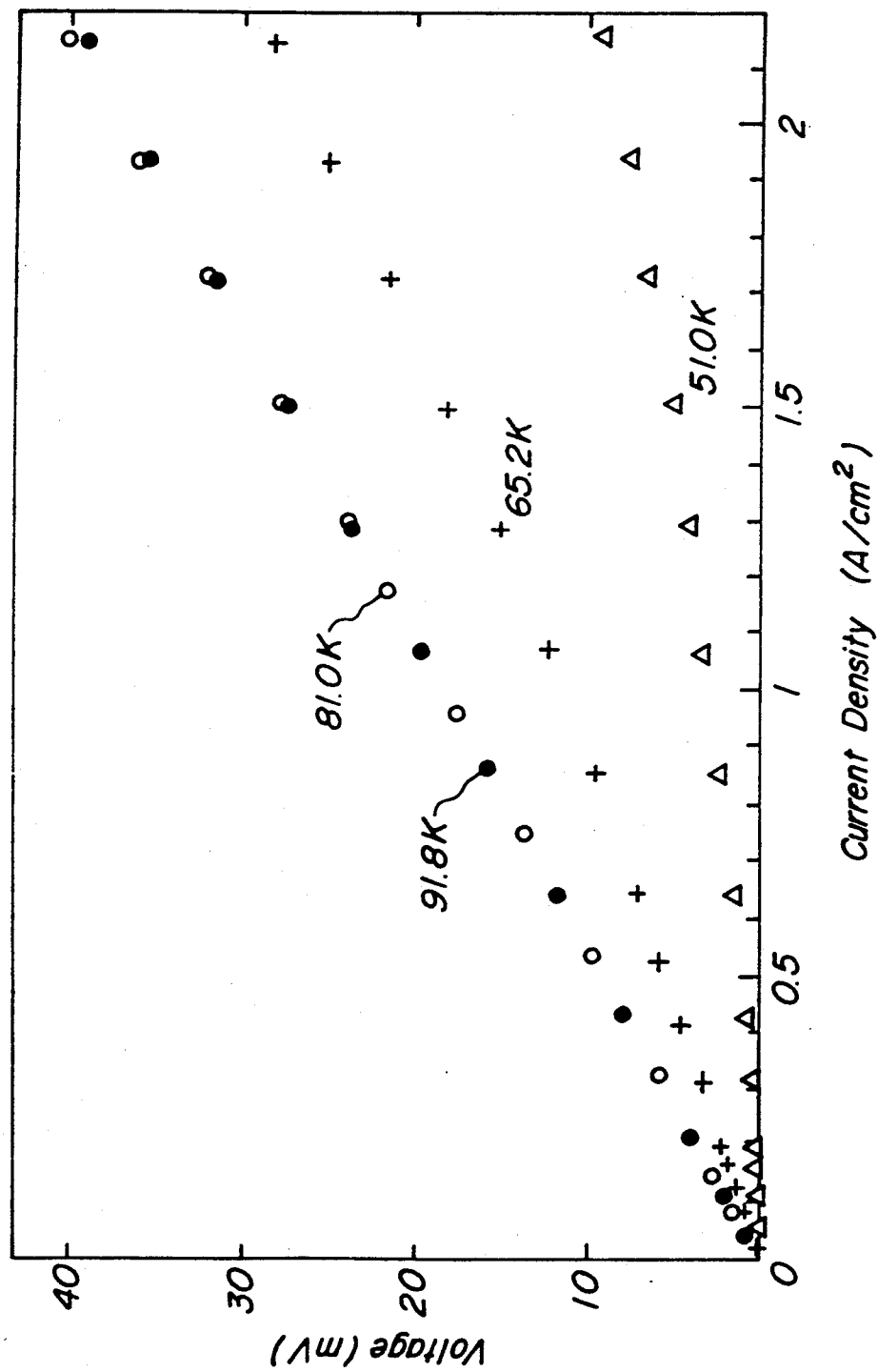

FIG. 4 depicts the I-V characteristic curves of the Specimen measured at temperature 51° K., 65.2° K. and 81° K. At such temperatures of FIG. 4, the resistivity of the Specimen assumed finite values for a current density of 21 mA/cm$^2$. It was found that the Specimen was a regular conductor at 91.8° K. regardless of the current density used. The output voltage assumed finite values at the above temperatures even when the current density was reduced to the minimum 2.1 mA/cm$^2$ in the measurement.

When the zero resistance state was lost due to the current increase or the temperature rise, the I-V characteristics curve became super-linear as can be seen from FIG. 3 and FIG. 4. Such I-V characteristics agrees with that of superconductor. The mechanism of the super-linear portion of the I-V characteristics appears to be as follows; namely, as the current increases, segments in the superconductive path turn into normal state one by one so as to join continuously to the normal path. Thereby the total resistance increases.

The above test result of the current density alone does not necessarily prove the present of a superconductor. However, the inventors consider that at least a part of the conditions for the superconductivity is satisfied.

Structure

The structure of Specimen pellets, which were taken from the same batch as the Specimens for the above resistivity measurement, was checked by the x-ray powder pattern method at room temperature. Their composition was identified as $Y_{0.294}Ba_{0.336}CuO_x$. For reference, x-ray diffraction patterns of Specimens without zero-resistance phenomenon, namely Specimens with compositions of $Y_{0.5}CuO_x$ and $Y_{0.411}Ba_{0.336}CuO_x$ were measured.

The Outside surface of the Specimen was light green. Similar measurement concerning the structure was taken on powders of $Y_2O_3$, BaO and CuO which might have remained in the Specimen as residuals of starting material. The measurement was carried out by using an x-ray diffraction meter and CuK$\alpha$x-ray which are common for polycrystal materials.

Figure 5A:
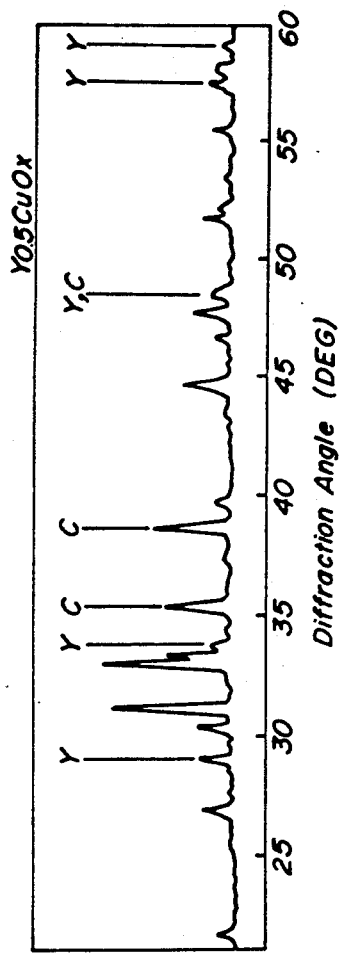
FIG. 5A, FIG. 5B and FIG. 5C are curves showing x-ray diffraction patterns of Specimens of the superconductive substance of the invention.
Figure 5B:
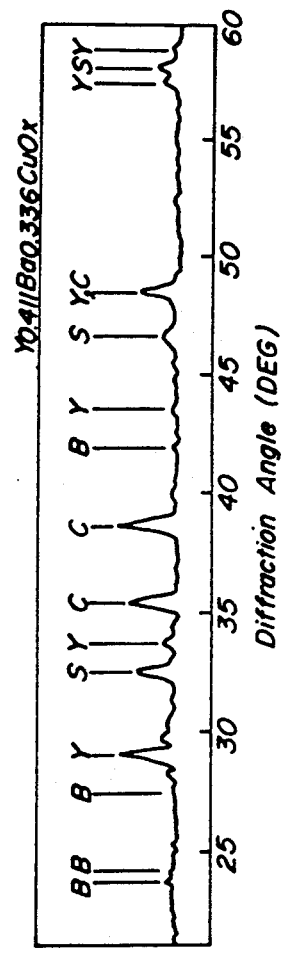
Figure 5C:
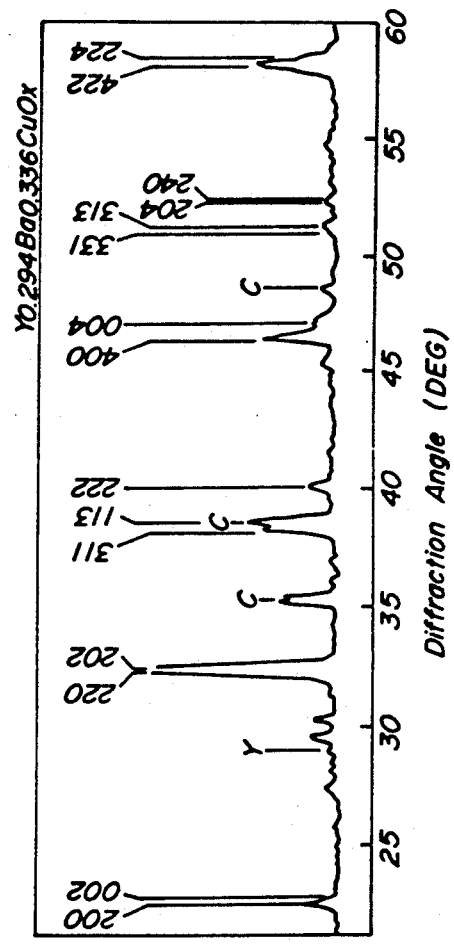

FIG. 5A shows a diffraction pattern for Specimen of $Y_{0.5}CuO_x$ composition, and FIG. 5B shows a diffraction pattern for Specimen of $Y_{0.411}Ba_{0.336}CuO_x$, while FIG. 5C shows a diffraction pattern for the Specimen of the invention with a composition of $Y_{0.294}Ba_{0.336}CuO_x$. The predominant peaks in the superconductive Specimen were identified by using the face-centered tetragonal crystal lattice with cell parameters of $$a = b = 7.83 \pm 0.02 \text{ Å}$$

$$c = 7.72 \pm 0.03 \text{ Å}$$

and CuO lattice. The tetragonal cell may be assumed to be composed of eight cells (2×2×2) of $Y_{1-x}Ba_xCuO_3$ with perovskite-type structure. The reasons for such assumption are as follows:

(1) The cell parameters were about twice as large as those of a regular crystal of perovskite-type structure.

(2) Despite the presence of a considerable amount of residual CuO, the content of CuO crystal lattices in the Specimen was less than that in the starting material with a ratio (Y, Ba):Cu = 0.63:1.

If the crystal structure of the present Specimen is to have a face-centered symmetry, the perovskite-type lattice must change, even when the zone boundary phonon with a wavelength vector Q = (0.5, 0.5, 0.5) freezes. The most likely mode of atomic dislocation is the rotation of oxygen octahedron with respect to its axis C.

In diffraction patterns of FIG. 5A, FIG. 5B and FIG. 5C, the symbols Y, C, B and S respectively designate peaks for $Y_2O_3$, peaks for CuO, peaks for BaO and peaks for that substance which rules the Specimen capable of showing zero resistance.

The diffraction peak S of the Specimen whose superconductivity was identified was also found in the non-superconductive reference Specimen with a small barium content, as shown in FIG. 5B. However, the diffraction peak S disappeared in the pattern of the $Y_{0.5}CuO_x$ Specimen, as shown in FIG. 5A. Thus, it is inferred that the composition $Y_{1-x}Ba_xCuO_x$ can show the superconductivity and that the unit cell of face-centered tetragonal crystal structure is composed of eight units of perovskite-type structure. However, the inventors do not deny such possibility that other phases existing in small quantities in the Specimen may become truly superconductive.

It is emphasized again that the substance of FIG. 5C showed the disappearance of electric resistance.

Embodiment 4

The inventors found a new superconductor having a high transformation critical temperature Tc. The superconductor starts its transformation for super conductivity at 85° K., and its transformation critical temperature Tc for realizing the completely zero resistance stat is high. The critical current and the crystal structure of such superconductor have been checked as described in the above.

However, it is further necessary to confirm the presence of complete diamagnetism is order to prove the occurrence of superconductive phenomenon. To provide a direct evidence of the complete diamagnetism at least in a part of fine powder of Y-Ba-Cu-O system oxides, tests were made on such oxide powder at 4.2° K. by using a meter of microwave SUID (superconducting quantum interface device) type.

The Specimens of the Y-Ba-Cu-O system oxides for the diamagnetism tests were the same as those used in the above-described tests on resistivity, critical current and crystal structure. The resistivity of the Specimen at the transformation-starting temperature was in a range of 76 to 242 m$\Omega$·cm, and their crystal structure was of perovskite type in the main as determined by the x-ray diffraction method.

The magnetostatic induction of the Specimen was measured by a microwave SQUID meter which was adapted to operate by a bias frequency of 9-35 GHz. The meter was operated under the mode locked for Q-pattern. The band width of the SQUID system covered from D.C. to 200 KHz, and its rotating speed was about 104 $\Phi_0$/sec. The measurement was carefully conducted by the microwave SQUID meter while using some reference Specimens made of diamagnetic leads. FIG. 6A, FIG. 6B and FIG. 7 show the results.

Tracings of both typical signals induced by the strong diamagnetic magnetization in the substantially spherical Specimen of the Y-Ba-Cu-O oxides and reference signals induced by a completely diamagnetic Specimen of lead (Pb) are shown in the figures. Static diamagnetic induction X (H, T) can be determined by using the derivative of the magnetic susceptibility M (H, T) as a function of the magnetic field intensity H applied thereto.

FIG. 6A shows the tracing of a typical output signal from the microwave SQUID meter produced by the magnetic susceptibility M of substantially spherical Specimen No. 16 made of a superconductor. FIG. 6B shows the tracing of a typical output signal from the same meter produced by the magnetic susceptibility M of Specimen No. 12 made of insulating substance consisting of a Y-Ba-Cu-O oxide. The magnetic field intensity H was 11.2 Oe in the case of FIG. 6A and 48 Oe in the case of FIG. 6B. FIG. 6C shows a reference signal from a ball-like Specimen of lead (Pb).

FIG. 7 shows the dependence of the magnetic susceptibility on the magnitude of the magnetic field intensity H applied thereto at temperature 4.2° K. for the two cases; namely, the substantially spherical Speciman 16 of superconductor consisting of Y-Ba-Cu-O oxide, and the Specimen No. 12 of insulating substance consisting of Y-Ba-Cu-O oxide.

The output signal from the Specimen No. 16 clearly indicates a very large value, i.e., about 9%, of complete diamagnetism. The sign of FIG. 6A shows the diamagnetism. The output signal from the Specimen No. 12 indicates paramagnetism. FIG. 7 is a graph prepared by plotting the magnetic susceptibilities M of the Specimens No. 12 and No. 16 as a function the magnetic field intensity H applied thereto.

Since the Specimens were sintered, there was certain difficulty in carrying out the measurement and analyzing the result. Nevertheless, it is noted that the measurement of the magnetic susceptibility M is sensitive only to the net magnitude of the integrated value. Accordingly, the inventors concluded that the new compound of Y-Ba-Cu-O oxide type contained a large amount of strong diamagnetic portions.

Thus, the presence of complete diamagnetism in the superconductive Y-Ba-Cu-O oxide substance with a high transformation-starting critical temperature $T_c$ was proved by a direct evidence provided by the observation of the magnetic induction. In short, the presence of the Meissner effect in at least a part of the above superconductive oxide substance was confirmed.

Embodiment 5

The inventors checked the effect of the magnetic field on the superconductive critical temperature of the above-mentioned Y-Ba-Cu-O oxide substance. When a magnetic field H of 1 kOe was applied to the above-mentioned Y-Ba-Cu-O oxide substance at a temperature higher than its transformation-starting temperature $T_{onset}$, the transformation-starting temperature $T_{onset}$ increased from 85° K., for the case without the magnetic field, to 105° K. It was also observed that once the magnetic field H is applied to the oxide substance, the effect of increasing the transformation-starting temperature $T_{onset}$ was maintained under certain conditions even after the magnetic field was removed.

More particularly, Specimens of the Y-Ba-Cu-O oxide substance were prepared in the foregoing Embodiments so as to confirm the presence of zero resistance and complete diamagnetism in the oxide substance and to determine its crystal structure.

To check of the effect of Magnetic field, Specimens of the Y-Ba-Cu-O oxide substance were prepared from the starting material of a composition $Y_{0.294}Ba_{0.269}Cu_1O$ by the same method as described above by referring to Embodiments 2 and 3. The Specimen of this Embodiment was in the form of a pipe with substantially rectangular parallel ends. An electric current path thereof had a cross section of about 0.2 cm by 0.7 cm, and the distance between voltage probes was about 0.3 cm. The critical current of the Specimen for causing finite electric resistance was about 11 mA at the helium temperature. To minimize the temperature gradient between the Specimen and the platinum thermometer, both the Specimen and the thermometer were placed in a hermetic specimen chamber made of copper. The magnetic field was applied in the direction of the flow of electric current.

Figure 8:
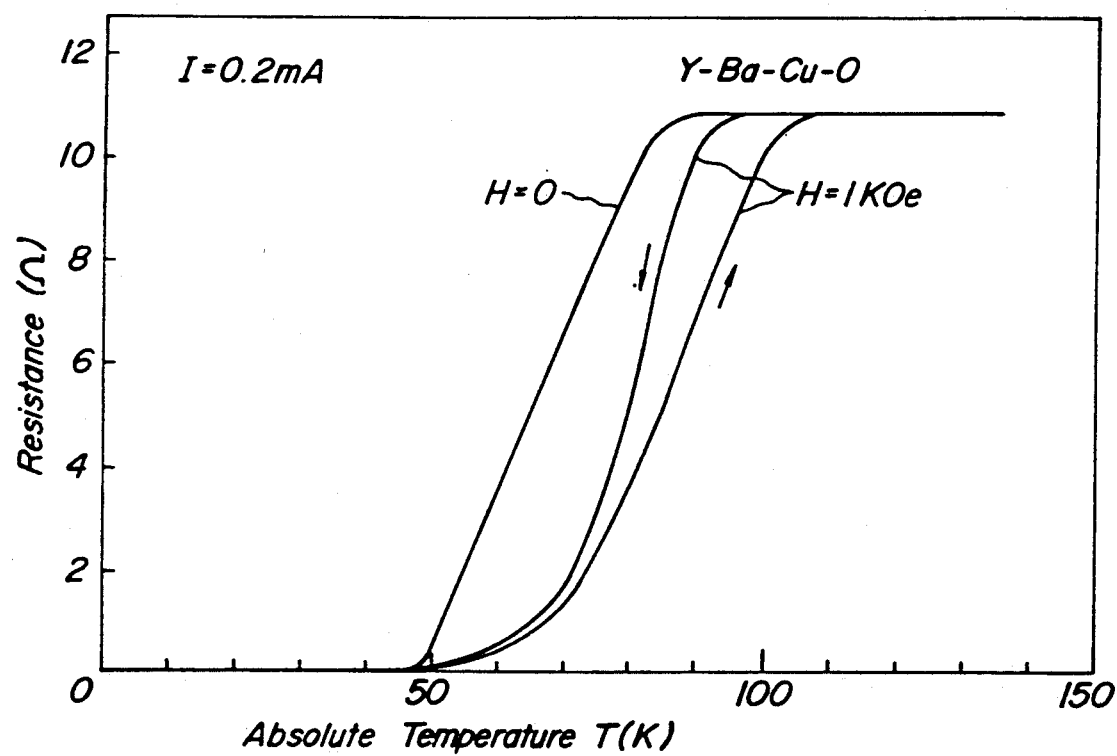
FIG. 8 is a graph showing the temperature-dependency characteristics of the electric resistance of the oxide of Y-Ba-Cu-O system when a current $I=0.2$ mA is applied thereof with a magnetic field $H=1$ kOe and without any magnetic field $H=0$.

FIG. 8 shows that application of magnetic field to the superconductive substance causes a considerable shift of its transformation-starting temperature $T_{onset}$. Without any magnetic field H, the resistance R of the superconductive substance started to reduce at about 86° K. ($T_{onset}$=86° K.), and the resistance R disappeared at 46° K. ($T_{zero}$=46° K.). When no magnetic field was applied (H=0), the R-T curve, i.e., the resistance versus temperature characteristics, was the same for both cases of increasing the temperature and reducing the temperature, so that the R-T curve did not have any hysteresis. On the other hand, when a magnetic field of 1 kOe was applied to the Specimen at 135° K. which was a sufficiently higher than the transformation-starting temperature $T_{onset}$ under the condition of no magnetic field (H=0), the resistance started to reduce at 94° K. ($T_{onset}$=94° K.) in case of temperature-reducing sweep and at 105° K. ($T_{onset}$=105° K.) in case of temperature-raising sweep. Thus, a sizeable shift of the transformation-starting temperature $T_{onset}$ in response to the application of magnetic field was observed.

The resistance-disappearing temperature ($T_{zero}$) was reduced to 33° K. with the magnetic field H of 1 kOe for both the temperature-reducing and temperature-raising sweeps. This phenomenon may be due to possible decay of weak links which exist in the neighborhood of the resistance-disappearing temperature ($T_{zero}$) for zero magnetic field (H=0).

When a magnetic field H of 5 kOe (H=5 kOe) was applied to the Specimen at 135° K., similar result as the above was obtained. The increase of the transformation-starting temperature $T_{onset}$ for a comparatively strong magnetic field of H=0 kOe is not much different from that for a comparatively weak field of H=1 kOe.

If the magnetic field H was removed and reduced to zero at 135° K., the resistance versus temperature curve for H=0 as shown in FIG. 8 was recovered.

The inventors checked the variation of the resistance of the Specimen of the substance of the invention as a function of magnetic field H applied thereto at a given constant temperature. With the temperature kept at 97° K., the magnetic field applied to the Specimen was varied in a range of $-31 \text{ kOe} \leq H \leq +31$ kOe but there was no significant change in its resistance. This phenomenon cannot be expected directly from the result of FIG. 8, and it does not exclude the dependence of the substance resistance on the history of magnetic field applied thereto.

To directly check the memory effect, after a magnetic field of $H = \pm 27$ kOe was applied to the Specimen at 81° K., the magnetic field was removed and the temperature was reduced to the liquid helium temperature. When the temperature T was raised without applying any magnetic field H, the transformation-starting temperature $T_{onset}$ was shifted to 137 K as shown in FIG. 9. Further, when heat run was effected by raising and reducing the temperature repeatedly as shown by the solid line sweep of FIG. 9, the transformation-starting temperature $T_{onset}$ was 104° K. Thus, it was proved that the effect of the magnetic field H applied at temperature 86° K. remained even after the removal of such magnetic field H, and the effect was maintained throughout the heat run in line with of the above temperature sweep after the magnetic field removal.

The inventors also observed that both the transformation-starting temperature $T_{onset}$ and the zero-resistance temperature $T_{zero}$ were shifted when a current I therethrough was reduced to a very low level under the absence of magnetic field H. FIG. 10 shows the resistance-temperature (R-T) curves when the current was reduced to 0.023 mA while applying no magnetic field (H=0), which curves represent two cases with different heat runs along different sweeps. The Specimen of FIG. 10 was the same as that of FIG. 9. In the test result of FIG. 10, the transformation starting temperature $T_{onset}$ was in a range of 94°-107° K. and the zero-resistance temperature $T_{zero}$ was in a range of 54°-69° K. Thus, the result of FIG. 10 for I=0.013 mA is completely different from that of FIG. 9 for I=0.52 mA.

In one of the two cases shown in FIG. 10, the transformation-starting temperature $T_{onset}$ was 107° K. and the zero-resistance temperature $T_{zero}$ was 69° K. The reason for such large shifts of both the transformation-starting temperature $T_{onset}$ and the zero-resistance temperature $T_{zero}$ is not clearly known yet. It may be due to the reduction of current I alone, or may be also due to other factors which have not yet been identified.

The inventors have found the above mentioned peculiar effects of magnetic field on the superconductivity of the Y-Ba-Cu-O oxide substance, but satisfactory explanation of the mechanism of such peculiar effects is not possible yet. The result of the above tests may indicate the need of introduction of new approach for the analysis of the superconductivity of the Y-Ba-Cu-O oxide substance.

The outstanding effects of the superconductive substance according to the present invention can be summarized as follows.

(1) A superconductive transformation-starting temperature of higher than the liquid nitrogen boiling point (77° K.) is achieved. Accordingly, superconductivity can be produced in a much easier manner than before, and it can be applied to a wide variety of electric and magnetic equipments.

(2) The oxide of the invention is stable even when heated at a high temperature of 500°-550° C. in air. Thus, the superconductive substance consisting of such oxide is comparatively free from limitations in the process of manufacturing various apparatus therefrom.

(3) In view of its high transformation-starting temperature in the proximity of the liquid nitrogen boiling point, the superconductive substance is suitable for devices using the high transformation-starting temperature, such as Josephson elements.

(4) Being capable of starting the superconductive state at a temperature higher than the liquid nitrogen boiling point, the substance of the invention can provide the superconductivity more economically than by the conventional liquid helium method and more safely than by the conventional liquid hydrogen method.

Although the invention has been described with a certain degree of particularity, it is understood that the present disclosure has been made only by way of example and that numerous changes in details may be resorted to without departing from the scope of the invention as hereinafter claimed.

What is claimed is:

1. A superconductive substance comprising a ceramic consisting essentially of a composition represented by the general formula $Y_xBa_yCuO_z$, x being 0.294;
y being 0.336,
z is approximately 1.77 said substance having a face-centered tetragonal crystalline structure of a perovskite type with lattice parameters a, b and c under conditions of $a=b \neq c$ and an axial angle of 90 degrees, when the substance is cooled from a temperature above the boiling point of nitrogen, said substance starting to transform at 85°-137° K. and vanishing electric resistance thereof at a temperature higher than 47° K. so as to become superconductive.

2. A superconductive substance as set forth in claim 1, wherein the perovskite type structure forms a unit cell of face-centered tetragonal crystal structure with the following lattice parameters:
$a=b=7.83\pm0.02$Å
$c=7.72\pm0.03$Å.

3. A superconductive substance consisting essentially of a composition represented by the general formula $Y_xBa_yCuO_z$, x being 0.294,
y being 0.336;
z is approximately 1.77;

said substance having a face-centered tetragonal crystalline structure of a perovskite type with lattice parameters a, b and c under conditions of $a=b \neq c$ and an axial angle of 90 degrees, when the substance is cooled from a temperature above the boiling point of nitrogen, said substance starting to transform at 85°-137° K. and vanishing electric resistance thereof at a temperature higher than 47° K. so as to become superconductive, wherein the substance is prepared by sintering a mixture of calculated amounts of $Y_2O_3$, $BaCO_3$ and CuO for about two hours at a temperature of 800° C.-850° C. in an electric furnace to form a sintered composition, and cooling the sintered composition so as to produce said crystalline structure.

4. A superconductive substance as set forth in claim 3, wherein the perovskite type structure forms a unit cell of face-centered tetragonal crystal structure with the following lattice parameters:
$a=b=7.83\pm0.02$Å
$c=7.72\pm0.03$Å.

* * * * *